US012801817B2

(12) United States Patent
Varghese et al.

(10) Patent No.: US 12,801,817 B2
(45) Date of Patent: Nov. 17, 2026

(54) SYSTEM LEVEL FUNCTIONAL AND PERFORMANCE VERIFICATION ACROSS PROTOCOLS/PLATFORMS USING SYSTEM ANALYZER

(71) Applicant: Synopsys, Inc., Sunnyvale, CA (US)

(72) Inventors: Ray Ranjan Varghese, Bangalore (IN); Jitendra Puri, Vikas Puri (IN); Abhijeet Khopkar, Bangalore (IN); Deenadayalan K, Bangalore (IN); Viral Sharma, Bangalore (IN)

(73) Assignee: Synopsys, Inc., Sunnyvale, CA (US)

( * ) Notice: Subject to any disclaimer, the term of this patent is extended or adjusted under 35 U.S.C. 154(b) by 774 days.

(21) Appl. No.: 18/224,862

(22) Filed: Jul. 21, 2023

(65) Prior Publication Data

US 2025/0028886 A1 Jan. 23, 2025

(51) Int. Cl.
*G06F 30/33* (2020.01)

(52) U.S. Cl.
CPC .................................... *G06F 30/33* (2020.01)

(58) Field of Classification Search
CPC ........................................................ G06F 30/33
USPC .......................................................... 716/106
See application file for complete search history.

(56) References Cited

U.S. PATENT DOCUMENTS 8,838,869 B1 * 9/2014 Puranik ............... G06F 13/4022
710/312

* cited by examiner

*Primary Examiner* — Eric D Lee
(74) *Attorney, Agent, or Firm* — Patterson + Sheridan, LLP

(57) ABSTRACT

System level functional and performance verification across protocols/platforms using a system analyzer that includes a protocol adaptor engine that includes multiple protocol adaptors that convert transactions of a circuit design from respective protocols of the circuit design to a unified protocol, to provide respective unified protocol transactions, and a core engine that includes multiple subsystem monitors configured to monitor respective user-defined subsystems of the circuit design, including to correlate upstream unified protocol transactions of the respective subsystems with downstream unified protocol transactions of the respective subsystems, perform integrity checks on the correlated unified protocol transactions, and report correlation and integrity checking results to an application manager. The application manager may permit user-configuration of the protocol adaptor engine, correlation policies, and/or integrity checking features.

20 Claims, 12 Drawing Sheets

SYSTEM LEVEL FUNCTIONAL AND PERFORMANCE VERIFICATION ACROSS PROTOCOLS/PLATFORMS USING SYSTEM ANALYZER

TECHNICAL FIELD

The present disclosure relates to system level functional and performance verification across protocols/platforms using system analyzer.

BACKGROUND

A circuit may include multiple intellectual property (IP) blocks, such as processors, interconnects (e.g., a network-on-chip, or NoC), and/or memory, that interface with one another using a variety of communication protocols. As information (e.g., commands, addresses, and/or data) flows through the circuit, a downstream IP block may transform the information from a protocol of an upstream IP block to a protocol of the downstream IP block. For example, a processor instruction may be transformed to a protocol of an interconnect subsystem (e.g., AMBA 4 AXI), and may thereafter be transformed to a memory protocol (e.g., LPDDR). As another example, information from an external device, formatted in accordance with a peripheral component interconnect express (PCIe) protocol, may be converted to the protocol of the interconnect subsystem, and may thereafter be converted to the memory protocol.

It would be useful to have a system analyzer (e.g., an electronic design automation (EDA) tool) that tracks/correlates information as the information flows through IP blocks of a circuit design, and performs functional and performance verification with respect to the correlated information of the circuit design. It would be further useful for the system analyzer to be configurable for differing protocols of the IP blocks and/or for the system analyzer to perform functional and performance verification substantially independent of the differing protocols. It would be further useful for the system analyzer to be configurable for various circuit designs, and scalable for increasingly complex circuit designs.

SUMMARY

Techniques for system-level functional and performance verification across protocols/platforms using system analyzer are disclosed herein.

An example is a non-transitory computer readable medium include stored instructions, which when executed by a processor, cause the processor to convert upstream and downstream transactions of a subsystem of a circuit design from protocols of the respective upstream and downstream transactions to a unified protocol to provide respective upstream and downstream unified protocol transactions, and correlate the upstream unified protocol transactions of the subsystem with the downstream unified protocol transactions of the subsystem.

Another example is a method that includes converting transactions of a circuit design from protocols of the respective transaction to a unified protocol to provide respective unified protocol transactions, and monitoring multiple user-defined subsystems of the circuit design, including correlating upstream unified protocol transactions of the subsystems with downstream unified protocol transactions of the respective subsystems.

In another embodiment, an apparatus includes memory circuitry having instructions stored therein, and a processor configured to retrieve the instructions from the memory circuitry and to execute the instructions, where the instructions, when executed, cause the processor to convert upstream and downstream transactions of multiple subsystems of a circuit design from protocols of the respective upstream and downstream transactions to a unified protocol to provide respective upstream and downstream unified protocol transactions, correlate the upstream unified protocol transactions of the subsystems with the downstream unified protocol transactions of the respective subsystems based at least in part on destination addresses of the respective upstream and downstream unified protocol transactions, perform an integrity check on the correlated upstream and downstream transactions, and report results of the correlating and results of the integrity checking.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
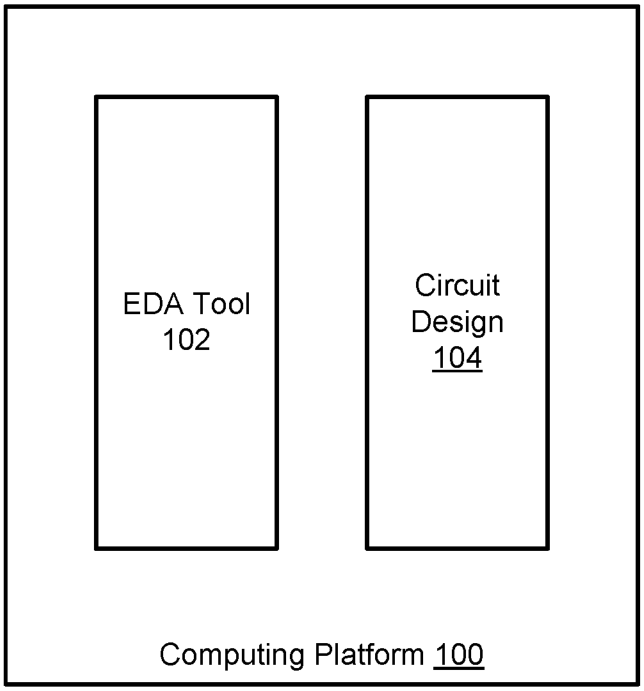
FIG. 1 is a block diagram of a computing platform that includes a system analyzer that evaluates transactions within a circuit design as the transactions flow through protocol boundaries within the circuit design, according to an embodiment.

Techniques are disclosed herein for system-level functional and performance verification across protocols/platforms using system analyzer.

Monitoring information flow across various protocol boundaries of a complex circuit design is challenging and error-prone. Techniques disclosed herein provide a modular, configurable, scalable approach for monitoring information flow through circuit designs.

In an embodiment, a system analyzer includes a core engine that include multiple configurable subsystem monitors that track and perform integrity checks on transactions (e.g., memory access requests/responses) as the transactions flow through respective user-defined subsystems of the circuit design. The subsystem monitors correlate upstream transactions with downstream transactions, within the respective subsystems, substantially independent of changes in formatting/protocols to the transactions as the transactions flow through the subsystems.

The system analyzer further includes a protocol converter that converts the transactions from various/diverse protocols of the circuit design to a generic or unified protocol, such that the subsystem monitors track and perform integrity checks on generic unified-protocol transactions. The protocol converter may embed protocol specific data (e.g., sideband signaling) in a unified-protocol transaction. The system analyzer may further include application manager that permits a user to develop, design, and/or configure circuit-design-specific and protocol-specific integrity checks and/or transaction correlation policies.

Several technical advantages of techniques disclosed herein are described below. Technical advantages are not, however, limited to the technical advantages described below.

A system analyzer, as disclosed herein, correlates transaction activity across various/diverse protocol boundaries, which is useful for system-level integrity checks, performance analysis, and debug. The correlation processes may be user-configurable (e.g., based on a circuit design).

A system analyzer, as disclosed herein, provides a divide-and-monitor approach that scales well for increasingly complex circuit designs (e.g., multi-chip/multi-die systems), and helps with traceability and debuggability of issues involving data corruption.

A system analyzer, as disclosed herein, provides "out-of-the-box" data integrity checks for heterogeneous circuit designs that utilize a variety of differing interface protocols, without loss of protocol-specific information (e.g., sideband signaling). Encoding protocol specific-information (e.g., sideband signaling) within unified-protocol transaction permits protocol specific integrity checks.

A system analyzer, as disclosed herein, operates substantially independent of underlying protocols of a circuit design. Checks and applications for specific circuit designs and topologies may thus be developed independent of protocols.

A system analyzer, as disclosed herein, may support various platforms, such as simulation, emulation, and/or virtual prototyping, and a broad range of interface protocols.

FIG. 1 is a block diagram of a computing platform 100 that includes a system analyzer 102 that evaluates transactions within a circuit design 104, as the transactions flow through protocol boundaries within circuit design 104, according to an embodiment. The transactions may be based on simulated, emulated, and/or modeled operations of circuit design 104, such as described further below with reference to FIG. 2. Alternatively, or additionally, system analyzer 102 may evaluate transactions of a physical embodiment of circuit design 104. System analyzer 102 may be useful as an electronic design automation (EDA) tool.

Computing platform 100 may include a processor(s) that executes instructions of a computer program embedded within a non-transitory computer readable medium (e.g., a memory/storage device), and/or circuitry configured to perform functions disclosed herein. Such circuitry may include fixed-function circuitry/logic, application-specific integrated circuitry (ASIC), and/or configurable/programmable circuitry, such as a field-programmable gate array (FPGA). Computing platform 100 may include a centralized computing platform and/or a distributed computing platform. Computing platform 100 may be accessible via a communication network, such as the Internet and/or other packet-switched communication network, such that a user may submit circuit design 104 to computing platform 100 via the communication network for processing by system analyzer 102.

Figure 2:
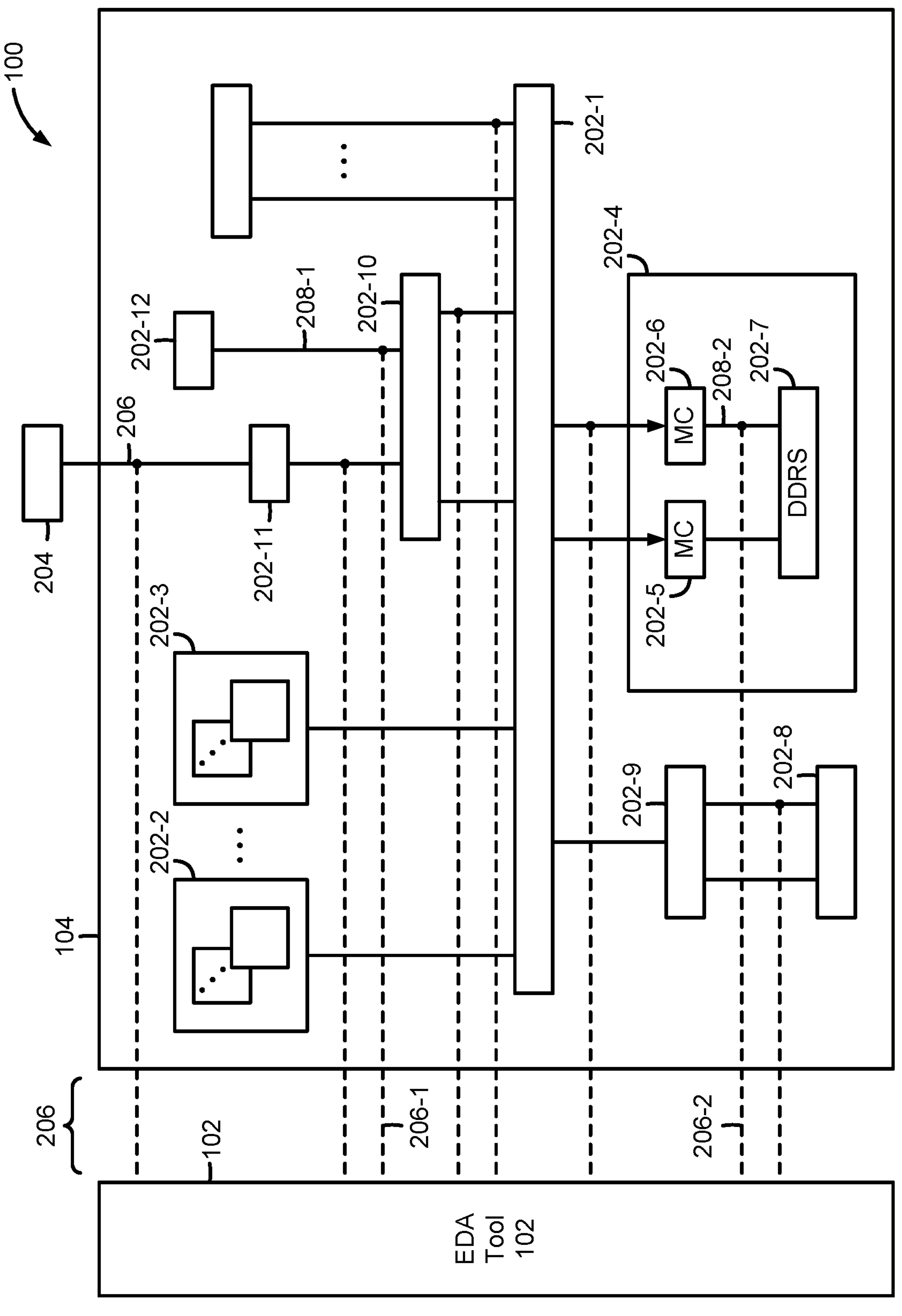
FIG. 2 is a block diagram of the computing platform, including example features of the circuit design, according to an embodiment.

FIG. 2 is a block diagram of computing platform 100, including example features of circuit design 104, according to an embodiment. The example features of FIG. 2 are provided for illustrative purposes. System analyzer 102 is configurable for a variety of circuit designs.

Circuit design 104 includes a multiple of circuit blocks, referred to herein as intellectual property (IP) blocks, 202-1 through **202-*n* (collectively, IP blocks 202). IP blocks 202 may include heterogeneous IP blocks that conduct transactions in respective protocols that differ from one another. IP blocks 202** may include hardware components such as processors, memory controllers, input/output devices, accelerators, and/or other types of IP blocks.

In the example of FIG. 2, IP blocks 202 include a interconnect circuitry 202-1, which may include network-on-chip (NoC) circuit that permits other IP blocks 202 to communicate with one another over a packet-switched communication network. IP blocks 202 further include multi-core processors 202-2 and 202-3. IP blocks 202 further include a memory system 202-4 that includes memory controllers 202-5 and 202-6, and memory cells 202-7 (e.g., double data rate random access memory, or DDRAM). IP blocks 202 further include interface circuitry 202-9 (e.g., a network interface controller, or NIC) that receive transactions from one or more peripheral IP blocks 202-8.

IP blocks 202 further include interface circuitry 202-10 (e.g., a NoC master unit, or NMU) that packetizes/de-packetizes transactions between interconnect circuitry 202-1 and IP blocks 202-11 and 202-12. IP block 202-11 may represent a network interface (NI) between an external input/output (IO) generator 204. IO generator 204 may represent a device for which circuit design 104 is designed to interface. IP block 202-12 may represent a peripheral device that uses a PCIe protocol.

IP blocks 202 further include circuitry 202-13, which may represent devices external to circuit design 104 (e.g., chiplets).

One or more of IP blocks 202 may represent simulated, emulated, and/or modeled operations of the respective IP block(s). System analyzer 102 may simulate or emulate operation of an IP block 202 based on machine-readable code of the IP block 202, such as register transfer level (RTL) code. Computing platform 100, or another computing platform, may simulate an IP block 202 by executing the RTL code of the IP block 202. Computing platform 100 may emulate an IP block 202 by configuring a hardware platform (e.g., containing configurable circuitry) based on the RTL code of the IP block 202. Computing platform 100 may model operations of an IP blocks 202 based on an abstract representation of the IP block 202. The abstract representation may be based on a transaction-level modeling language (TLML). A TLML is a hardware description language, typically written in C++ based on a SystemC library. TLMLs are useful for modelling where details of communication among IP blocks are separable from details of internal operations of the IP blocks. In an embodiment, system analyzer 102 models transactions to/from a VIP block using the unified protocol (e.g., a TLML protocol).

With a TLML, circuit components such as buses or FIFOs are modeled as channels, and are presented to modules using SystemC interface classes. Transaction requests take place by calling interface functions of these channel models, which encapsulate low-level details of the information exchange. At the transaction level, the emphasis is more on the functionality of the data transfers (i.e., data being transferred, and sources and destinations of the data) and less on their actual implementation, or transaction protocol. This approach makes it easier for a system-level designer to experiment, for example, with different bus architectures (all supporting a common abstract interface) without having to recode models that interact with any of the buses, provided that the models interact with the bus through a common interface. Transaction-level models may be useful for high-level synthesis of RTL models for lower-level modelling and implementation of system components. RTL code may be compiled from hardware description language source code (e.g. VHDL, SystemC, Verilog). A modeled IP block 202 may be referred to as a verification IP (VIP) block.

In FIG. 2, IP blocks 202 include heterogeneous IP blocks that conduct transactions based on protocols that differ from one another. Example protocols of transactions within circuit design 104 may include, without limitation, an advanced microcontroller bus architecture (AMBA) protocol, an advanced extensible interface (AXI) protocol, AXI coherency extensions lite (ACE-lite), a coherent hub interface (CHI) protocol, a peripheral component interconnect express (PCIe) protocol, and/or a low power double data rate (LPDDR) protocol.

Further in FIG. 2, system analyzer 102 monitors or receives transactions 206 from various nodes 208 of circuit design 104. The nodes may be user selectable. Examples are provided below with respect to transactions 206-1 at a node 208-1, and transactions 206-2 at a node 208-2.

Figure 3:
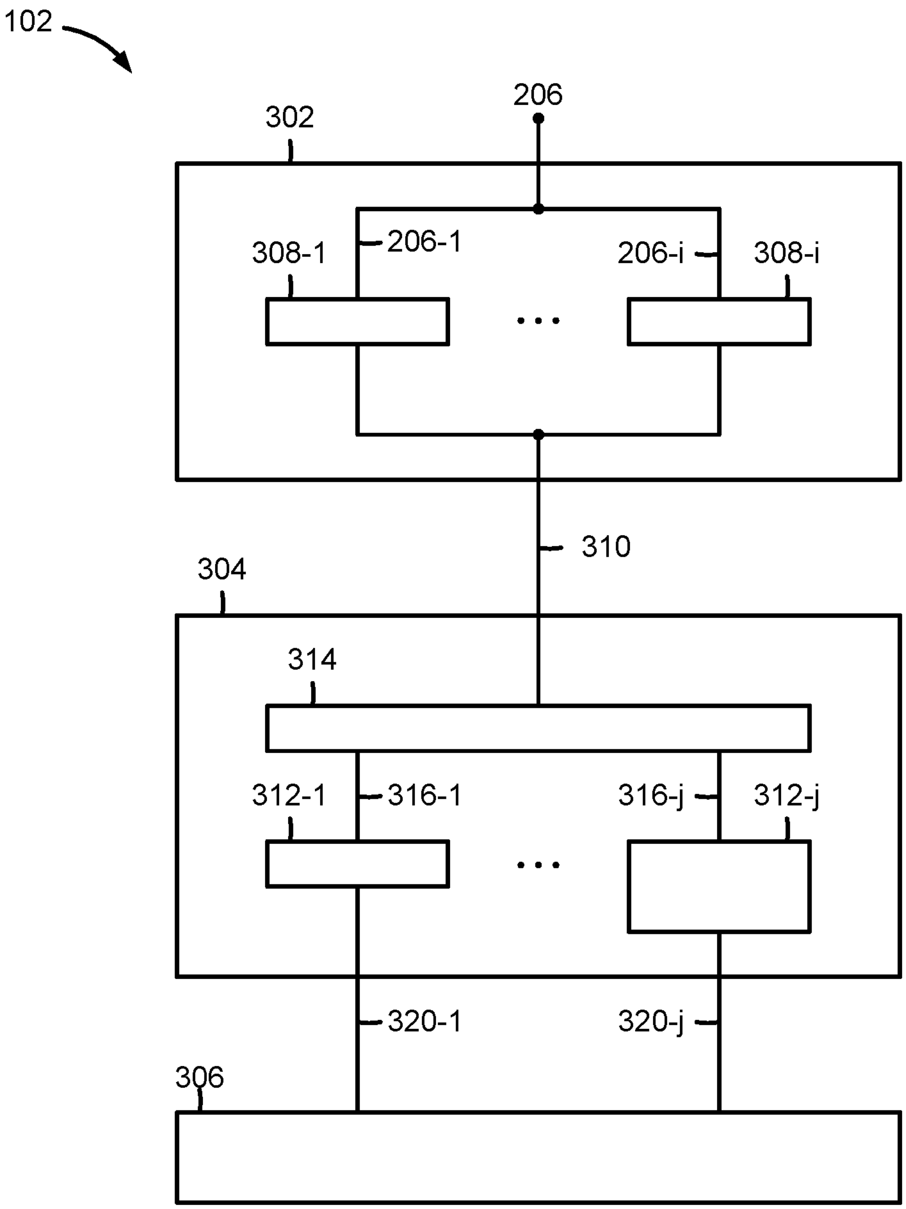
FIG. 3 is a block diagram of an expanded view of the system analyzer, according to an embodiment.

FIG. 3 is a block diagram of an expanded view of system analyzer 102, according to an embodiment. In the example of FIG. 3, system analyzer 102 includes a protocol adaptor engine 302, a core engine 304, and an application manager 306. Protocol adaptor engine 302 converts transactions 206 to a unified format, or protocol (e.g., a packet-based a TLM-based protocol), referred to herein as unified-protocol transactions. Core Engine 304 correlates the unified-protocol transactions of upstream ports with the unified-protocol transactions of downstream ports of circuit design 104, and performs integrity checks on the correlated transactions.

Application manager 306 provides a framework for developing checks/analysis engines for specific circuit designs and protocols. Application manager 306 may permit customizations to modify a transaction correlation algorithm(s). Such customizations may be based on circuit design specific sideband signaling (i.e., additional circuit design specific signals as compared to standard protocol signals), between upstream and downstream transactions.

In the example of FIG. 3, protocol adaptor engine 302 includes multiple protocol adaptors 308-1 through **308-*i* (collectively, protocol adaptors 308) that convert transactions 206 of respective protocols to unified-protocol transactions 310. Protocol adaptors 308, or a subset thereof, may be preconfigured based on pre-existing/conventional protocols. Alternatively, or additionally, protocol adaptor engine 302 may be user-configurable to construct and/or modify a protocol adaptor 308 (e.g., to convert a proprietary protocol to the unified protocol). Protocol adaptor engine 302** may also receive transactions that are pre-formatted in accordance with the unified protocol.

Core engine 304 analyzes unified-protocol transactions 310, independent of the protocols of respective transactions 206. In an embodiment, core engine 304 analyzes unified-protocol transactions 310 with a divide-and-monitor approach that scales well for large/complex circuit designs. In FIG. 3, core engine 304 includes a plurality of subsystem monitors 312-1 through **312-*j* (collectively, subsystem monitors 312), and a router 314 that routes unified-protocol transactions 310 to subsystem monitors 312-1 through 312-*j*, based on the user-defined subsystems from which unified-protocol transactions 310 originate. Outputs of router 314 are illustrated as unified-protocol transactions 316-1 through 316-*j* (collectively, unified-protocol transactions 316). Subsystem monitors 312 analyze transactions of respective user-defined subsystems of circuit design 104. Subsystem monitors 312 may, for example, track and correlate unified-protocol transactions 316 as the unified-protocol transactions 316 flow through the respective user-defined subsystems of circuit design 104. Subsystem monitors 312** may perform integrity checks on correlated transactions, and may report a transaction that do not correlate to another transaction.

Subsystem monitors 312 may track and correlate transactions through respective subsystems of circuit design 104 based on information contained in the unified-protocol transactions 316 (e.g., data, addresses, time stamps, commands, and/or sideband signaling information).

Figure 4:
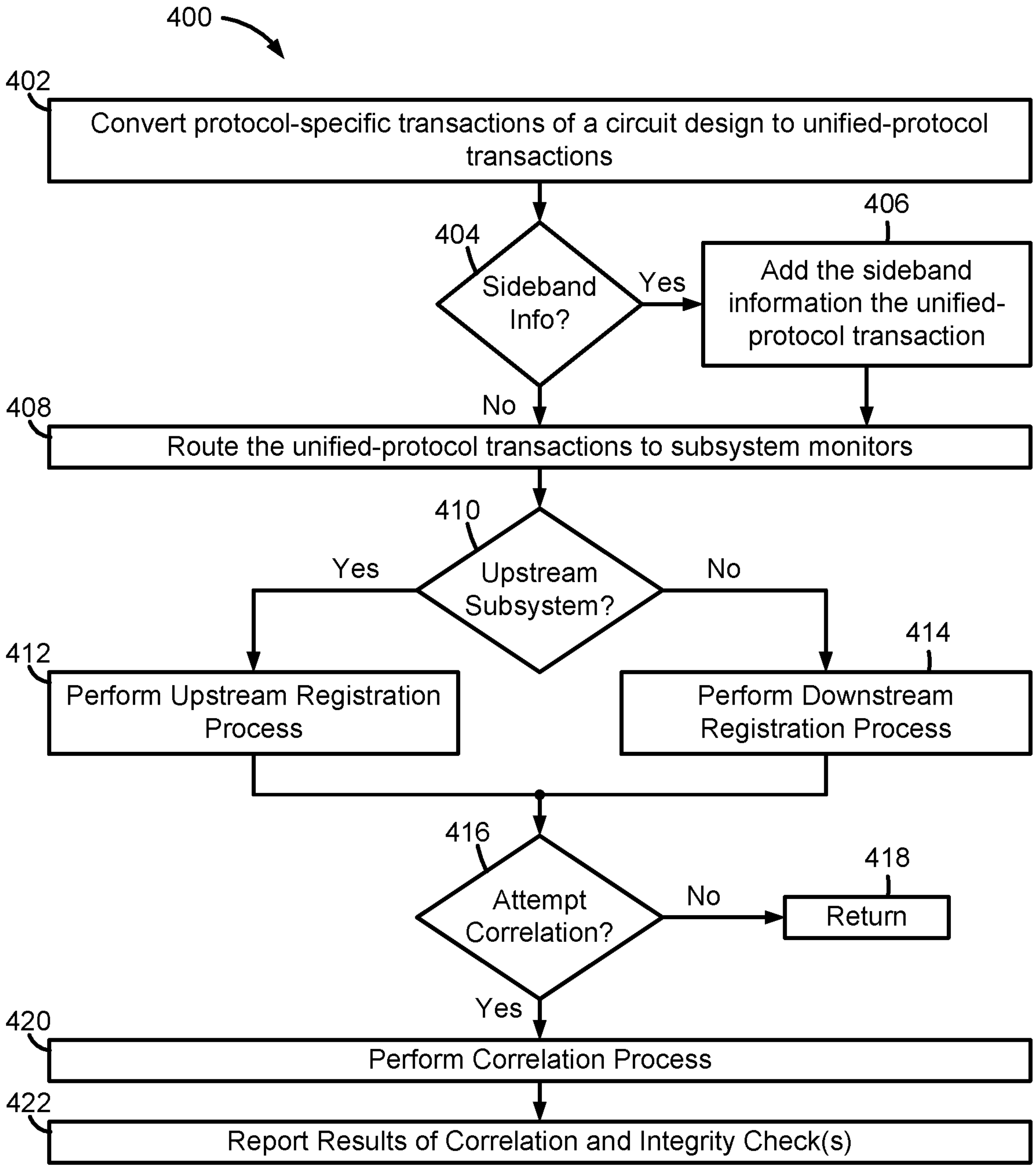
FIG. 4 is a flowchart of a method of evaluating transactions of a circuit design, according to an embodiment.

System analyzer 102 is described below with respect to FIG. 4. FIG. 4 is a flowchart of a method 400 of evaluating transactions of a circuit design, according to an embodiment.

Method 400 may be performed by system analyzer 102, as system analyzer 102 or another tool simulates, emulates, and/or models operation of IP blocks 202 of circuit design 104. Alternatively, method 400 may be performed by system analyzer 102 on a physical embodiment of circuit design 104.

Method 400 may be preceded by configuration of system analyzer 102 for user-defined subsystems of circuit design 104. System analyzer 102 may self-configure based on user-input (e.g., user-selection of upstream and downstream nodes, and/or IP blocks to include in subsystem). Configuring of system analyzer 102 may include assigning unique IDs to nodes (i.e., ports, or interfaces) of circuit design 104. A node may be assigned a unique ID for one or more parameters, such as protocol type, protocol role, port ID, and system ID. Protocol type refers to type of protocol such as CHI, PCIE, LPDDR. Protocol role is a role defined by the respective protocol. Example protocol roles include requestor, responder, host, or device. Port ID is an ID of a node within a context of a corresponding user-defined subsystem. System ID is an ID of the user-defined subsystem within the context of the protocol.

Configuring system analyzer 102 may include configuring subsystem monitors 312. A subsystem monitor 312 may include an array of downstream and upstream configurations, corresponding to the nodes monitored by the subsystem monitor 312. Each element in the downstream/upstream configuration refers to a respective node within the user-defined subsystem, based on the protocol type, protocol role, port ID, and system ID. Configuration parameters may be stored in a subsystem monitor configuration data structure.

Method 400 is described below with reference to FIGS. 1-3, for an example in which subsystem monitor 312-1 is configured to monitor a first user-defined subsystem of circuit design 104 that includes an upstream node 208-1 (e.g., PCIe transactions 206-1 from peripheral IP block 202-12), and a downstream node 208-2 (i.e., LPDDR transactions 206-2 from memory controller 202-6 to memory cells 202-7). Other subsystem monitors 312 may evaluate other user-defined subsystems of circuit design 104. A user-defined subsystem may fall entirely within another user-defined subsystem, or may overlap another user-defined subsystem, or may mutually exclusive of other user defined subsystems. Method 400 is not, however, limited to the foregoing examples.

At 402, protocol adaptor engine 302 convert protocol-specific transactions 206 of circuit design 104 to the unified format, to provide unified-protocol transactions 310.

Protocol adaptor engine 302 may capture addresses, data, byte enables, and/or commands of transaction 206. Once converted to a unified-protocol transaction, a reference to the protocol specific transaction is added. The reference enables access to protocol information for protocol specific checks and analyses.

A unified-protocol transaction 310 may include a destination address and data, and may further include embedded protocol-specific sideband signaling and/or an instruction. A unified-protocol transaction 310 may include one or more fields that may be used for protocol-specific checks. A unified-protocol transaction may be serialized or packetized (i.e., one or more packets).

For the example described above, one of protocol adaptors 308 converts transactions 206-1 from the PCIe protocol to the unified format, and another one of protocol adaptors 308 converts transactions 206-2 from the LPDDR protocol to the unified format.

At 404, if any of the protocol-specific transactions 206 contain sideband signals, processing proceeds to 406, where the sideband signaling information is added to the respective unified-protocol transaction 310. In FIG. 3, one or more of protocol adaptors 308 may capture protocol-specific attributes of a transaction 206. For example, a protocol may need specific checks on opcode or responses of transactions between source and destination. To facilitate this, a reference to protocol specific information is provided in a unified-protocol transaction and available to the user application.

At 408, router 314 routes unified-protocol transactions 310 to subsystem monitors 312, as unified-protocol transactions 316, based on the user-defined subsystems from which unified-protocol transactions 316 originate. Router 314 may route unified-protocol transactions 310 based on properties of the respective unified-protocol transactions 310 (e.g., protocol type, protocol role, system ID and/or port ID). Router may look-up the properties in the subsystem monitor configuration data structure. For the example described above, router 314 routes unified-protocol transactions 316 of nodes 208-1 and 208-2 to subsystem monitor 312-1.

At 410, if a unified-protocol transaction 310 received at 402 is an upstream transaction of a user-defined subsystem, the respective subsystem monitor 312 registers the unified-protocol transaction 310 with an upstream registration process at 412 (i.e., captures/records information of the unified-protocol transaction 310), such as described further below with reference to FIGS. 5 and 7. If a unified-protocol transaction 310 received at 402 is a downstream transaction of a user-defined subsystem, the respective subsystem monitor 312 registers the unified-protocol transaction 310 with a downstream registration process at 414, such as described further below with reference to FIGS. 6 and 8.

At 416, after registering an upstream unified-protocol transaction 310 at 412, or after registering a downstream unified-protocol transaction 310 at 414, the respective subsystem monitor 312 determines whether to attempt to correlate the upstream or downstream unified-protocol transaction 310 with previously-registered downstream or upstream unified-protocol transactions 310 of the respective user-defined subsystem.

For the example describe above, when subsystem monitor 312-1 registers an upstream unified-protocol transaction 310 at 412 (i.e., corresponding to a transaction 206-1 of node 208-1), subsystem monitor 312-1 determines, at 416, whether to attempt to correlate the upstream unified-protocol transaction 310 with a previously-recorded downstream unified-protocol transactions 310 (i.e., corresponding to transactions 206-2 of node 208-2). Subsystem monitor 312-1 may determine whether to attempt to correlate based on whether subsystem monitor 312-1 previously registered any downstream unified-protocol transactions 310 directed to an address of the upstream unified-protocol transaction 310 registered at 412. Example techniques for making such a determination are provided further below.

When subsystem monitor 312-1 registers a downstream unified-protocol transaction 310 at 414 (i.e., corresponding to a transaction 206-1 of node 208-1), subsystem monitor 312 determines, at 416, whether to attempt to correlate the downstream unified-protocol transaction 310 with previously-registered upstream unified-protocol transactions 310 (i.e., corresponding to transactions 206-2 of node 208-2). Subsystem monitor 312-1 may determine whether to attempt to correlate based on whether subsystem monitor 312-1 previously registered any upstream unified-protocol transactions 310 directed to an address of the downstream unified-protocol transaction 310 registered at 414. Example techniques for making such a determination are provided further below.

If a subsystem monitor 312 determines not to attempt correlation at 416, the subsystem monitor 312 returns to a prior state at 418. If the subsystem monitor 312 decides to attempt correlation at 416, the subsystem monitor 312 proceeds to 420.

At 420, the subsystem monitor 312 performs a correlation process in an attempt to correlate the unified-protocol transaction 310 registered at 412 or 414 with previously-registered upstream or downstream unified-protocol transactions 310 of the respective subsystem. The subsystem monitor 312 may, for example, compare an address, data, a time stamp, and/or sideband signaling data (e.g., a transaction identifier) of the unified-protocol transaction 310 registered at 412 or 414, to addresses, data, time stamps, and/or signaling information of the previously-registered upstream or downstream unified-protocol transactions 310.

If the subsystem monitor 312 successfully correlates the unified-protocol transaction 310 registered at 412 or 414 with a previously-registered unified-protocol transaction 310, the subsystem monitor 312 may perform one or more checks on the correlated unified-protocol transactions 310. The subsystem monitor 312 may, for example, perform an integrity check with respect to data and/or an addresses of the unified-protocol transaction 310 registered at 412 or 414. This is an example situation where sideband signaling data may be useful. A situation may arise, for example, in which there is transaction activity directed to overlapping addresses (e.g., that same data may be contained in two read requests). When performing an integrity check, it may be possible for the data to be swapped. In such a situation, it may be useful to encode design-specific or protocol-specific sideband signaling, which may be unique to a particular transaction.

At 422, the subsystem monitor 312 reports results of the correlation process (i.e., success or failure), and results of any integrity checks to application manager 306. In the event of failure to correlate, the subsystem monitor 312 may report details of the unified-protocol transaction 310 registered at 412 or 414 to application manager 306 (e.g., for user-review/confirmation).

Example registration and correlation techniques are provided below with reference to FIGS. 5-8. Example techniques for performing integrity checks are provided further below with reference to FIGS. 9 and 10. Methods and systems disclosed herein are now, however, limited to the examples provided below.

In an embodiment, each subsystem monitor 312 maintains upstream data structures and downstream data structures in which to register respective upstream and downstream unified-protocol transactions 316. Example upstream data structures are described below with reference to FIG. 5. Example downstream data structures are described below with reference to FIG. 6.

Figure 5:
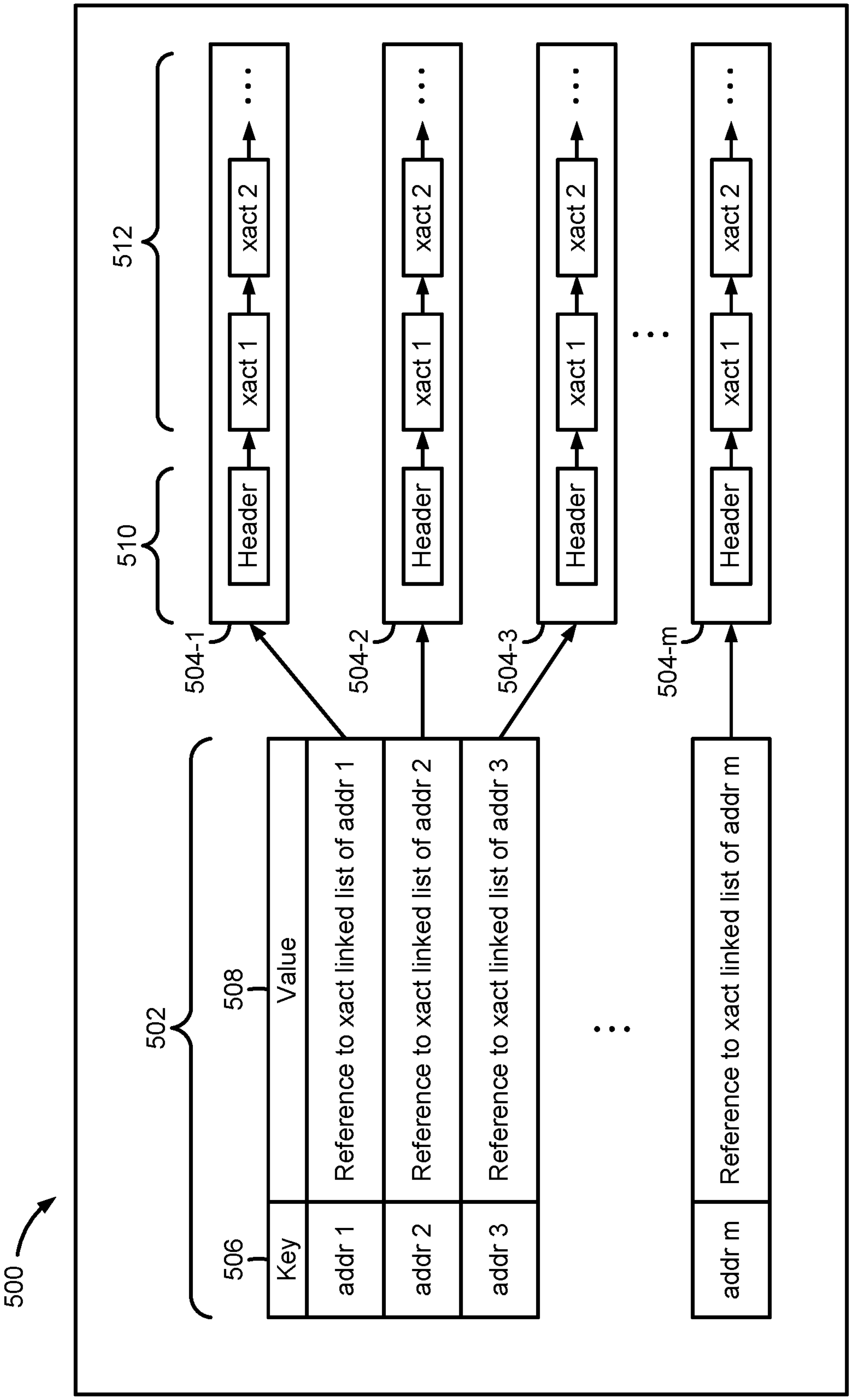
FIG. 5 illustrates upstream data structures of a subsystem monitor, for registering upstream unified-protocol transactions, according to an embodiment.

FIG. 5 illustrates upstream data structures 500 of subsystem monitor 312-1 for registering upstream unified-protocol transactions 310 (i.e., corresponding to transactions 206-1 of node 208-1), according to an embodiment. In the example of FIG. 5, data structures 500 include an upstream map 502 (e.g., a hash table) and address-specific upstream linked lists 504-1 through **504-*m* (collectively, upstream linked lists 504**).

Upstream linked lists 504 include records 512 of upstream unified-protocol transactions 310 (i.e., corresponding to a transaction 306-1 of node 208-1), registered by subsystem monitor 312-1. Upstream linked lists 504 further include headers 510. Subsystem monitor 312-1 stores a record of an upstream unified-protocol transaction 310 in one of upstream linked lists 504 based on an address contained within the upstream unified-protocol transaction 310. Upstream linked lists 504 may be sorted based on start times of time stamps of the respective transactions.

Upstream map 502 includes keys 506 and values 508. Keys 506 include addresses of upstream unified-protocol transactions 310 registered by subsystem monitor 312-1. Values 508 include references or pointers to respective upstream linked lists 504. The first entry of each key 506 may include a header with metadata. The metadata may include, for example and without limitation, information regarding local and system addresses, such as address conversion information for a situation where the address seen downstream is not the same as the address seen upstream (e.g., where an IP block within the user-defined subsystem performs address conversion/device virtualization).

Figure 6:
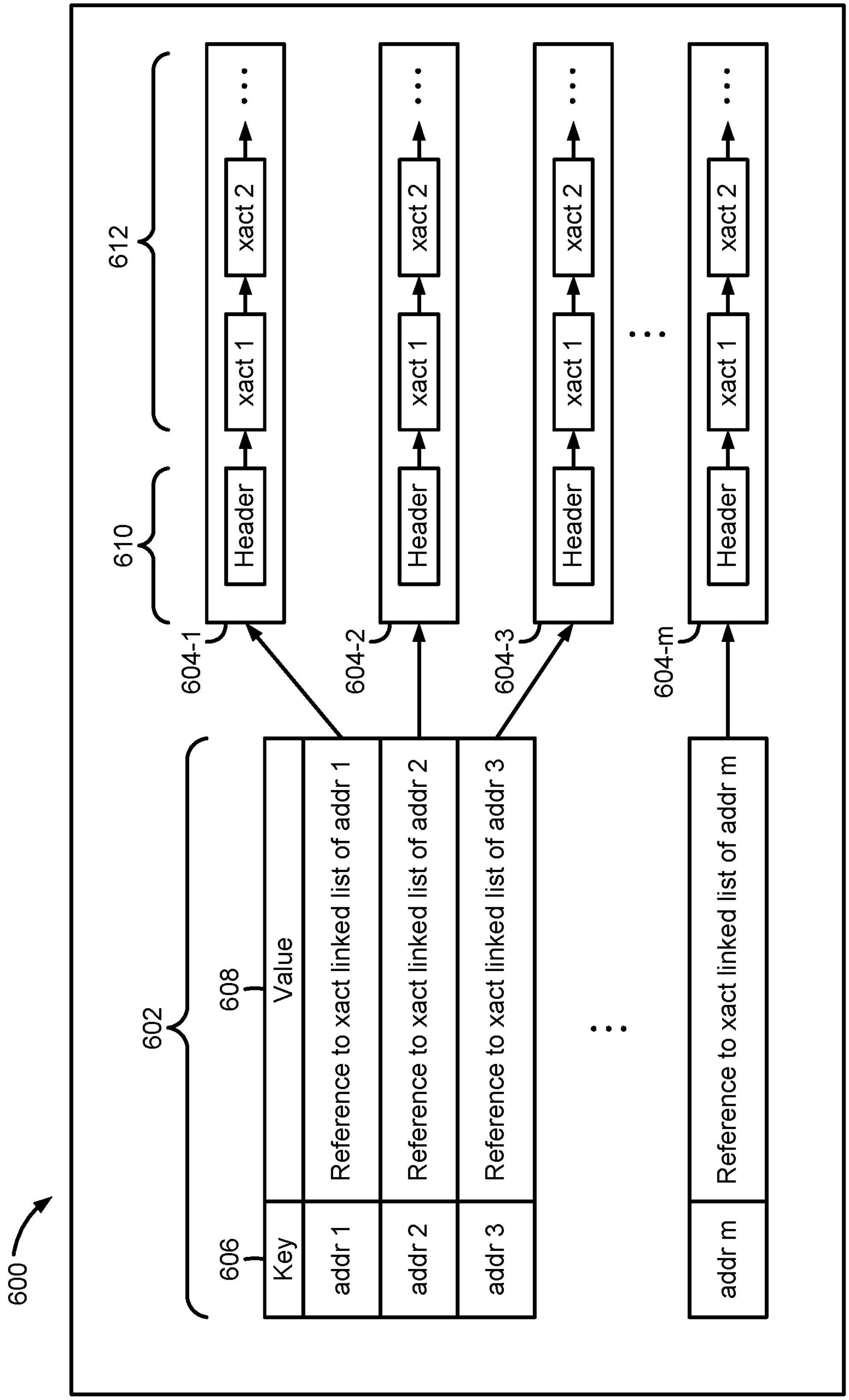
FIG. 6 illustrates downstream data structures of a subsystem monitor, for registering downstream unified-protocol transactions, according to an embodiment.

FIG. 6 illustrates downstream data structures 600 of subsystem monitor 312-1 for registering downstream unified-protocol transactions 310-2 (i.e., corresponding to transactions 206-2 of node 208-2), according to an embodiment. In the example of FIG. 6, data structures 600 include a downstream map 602 and address-specific downstream linked lists 604-1 through **604-*n* (collectively, downstream linked lists 604). Downstream map 602 includes keys 606 and values 608, and downstream linked lists 604 include records 612 and headers 610, such as described above with respect to FIG. 5**.

Other subsystem monitors 312 may maintain data structures similar to data structures 500 and 600. Data structures 500 and 600 are described below with reference to FIGS. 7 and 8. As illustrated below, data structures 500 and 600 provide scalability for large numbers of transactions, and may provide greater correlation efficiency relative to a flat queue approach.

Figure 7:
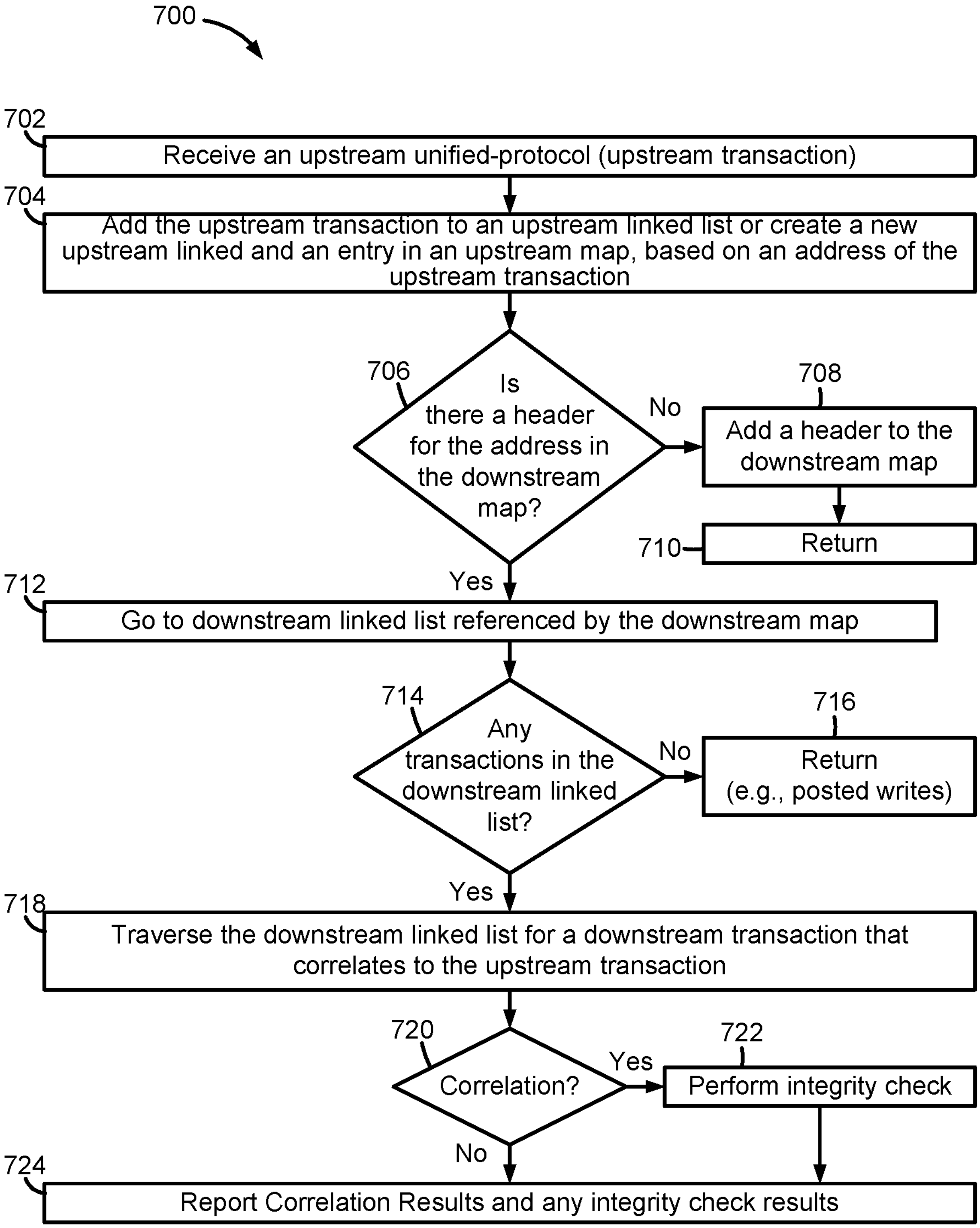
FIG. 7 is a flowchart of a method of registering an upstream unified-protocol transaction of a user-defined subsystem of a circuit design, according to an embodiment.

FIG. 7 is a flowchart of a method 700 of registering an upstream unified-protocol transaction of a user-defined subsystem of a circuit design, according to an embodiment. Method 700 may represent an example embodiment of upstream registration at 412 of FIG. 4. Method 700 is described below with reference to FIGS. 1 through 3, 5, and 6, and with respect the first user-defined subsystem of circuit design 104, described further above. Method 700 is not, however, limited to the foregoing examples.

At 702, subsystem monitor 312-1 receives an upstream unified-protocol transaction 310 (i.e., corresponding to a transaction 206-1 of node 208-1).

At 704, subsystem monitor 312-1 adds the upstream unified-protocol transaction 310 to an upstream linked list 504, based on an address of the upstream unified-protocol transaction 310. If an upstream linked list 504 does not exists for the address, subsystem monitor 312-1 creates a new upstream linked list 504 for the address, a header 510 for the new upstream linked list, a corresponding new entry in upstream map 502, and a header for the key 506 of the new upstream map entry.

At 706, subsystem monitor 312-1 checks headers of keys 606 of downstream map 602 for a header associated with the address of the upstream unified-protocol transaction 310 received at 702. If the upstream unified-protocol transaction 310 received at 702 is the first transaction associated with the address, there will be no header in keys 606. In this situation, processing proceeds to 708, where subsystem monitor 312-1 adds a new entry to downstream map 602 for the address, and adds a header to the key 606 of the new entry. Subsystem monitor 312-1 then returns to a prior state at 710. Adding the downstream header information based on an address of an upstream transaction may be where an address of a corresponding downstream transaction is based on an address translation computed from the address of the upstream transaction.

If one of keys 606 contains a header for the address, processing proceeds to 712, where subsystem monitor 312-1 accesses a downstream linked list 604 for the address based on the value 608 associated with the key 606. If the downstream linked list 604 for the address does not contain any transaction records 612, subsystem monitor 312-1 returns to a prior state at 716. The foregoing situation may result from a posted write. For example, in FIG. 2, multi-core processor 202-2 may send a write request to memory system 202-4 through interconnect circuitry 202-1. Interconnect circuitry 202-1 buffer the write request and send an early (i.e., posted) write response to multi-core processor 202-2. Interconnect circuitry 202-1 may forward the buffered write request to memory system 202-4 later. In this situation, a header may be created in a key 606 for the destination address well before the subsystem monitor receives and registers the write request in a downstream linked list 604 for the address.

If the downstream linked list 604 for the address includes any records 612, subsystem monitor 312-1 traverses the records 612 for a record that correlates to the upstream unified-protocol transaction 310 received at 702. Subsystem monitor 312-1 may correlate based on a correlation policy, which may be user-configurable. Subsystem monitor 312-1 may compare data, command, start times, sideband signaling data (e.g., transaction ID), and/or other information. A mismatch may occur where due to data mismatch, command mismatch, start time mismatch (i.e., a downstream start time should be later than an upstream start time). During the correlation process, subsystem monitor 312-1 may discount a record 612 of the downstream linked list 604 if the start time of the record 612 precedes the start time of the upstream unified-protocol transaction 310 received at 702.

If subsystem monitor 312-1 correlates the upstream unified-protocol transaction 310 received at 702 with a record 612, subsystem monitor 312-1 may perform an integrity check at 722. In an embodiment, subsystem monitor 312-1 also marks or tags the record 612 as a correlated record. In this embodiment, at 718, as subsystem monitor 312-1 traverses the records 612 of the downstream linked list 604, subsystem monitor 312-1 does not consider records 612 that are marked or tagged as correlated records.

At 724, subsystem monitor 312-1 reports correlation results and results of any integrity checks to application manager 306.

Figure 8:
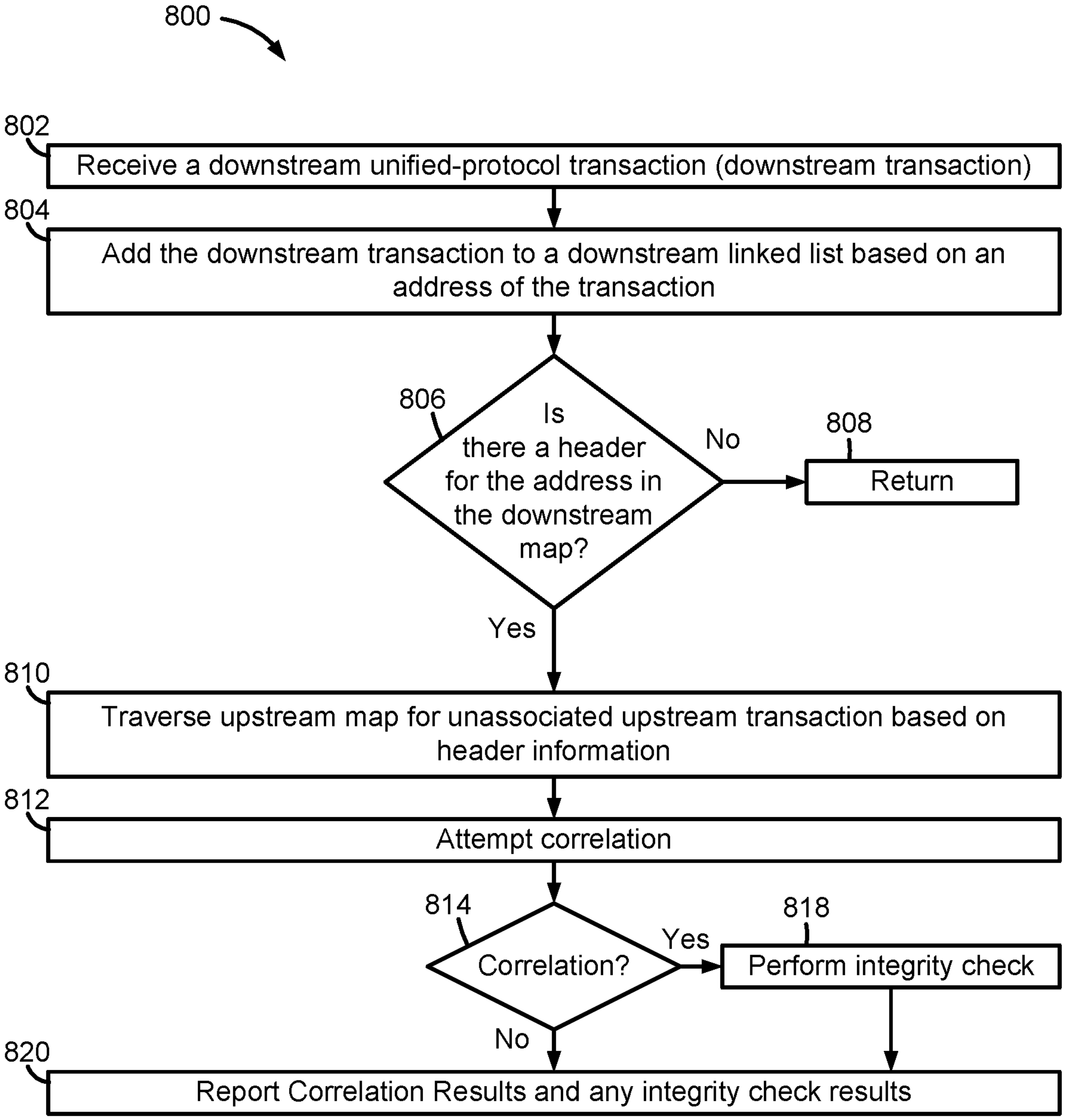
FIG. 8 is a flowchart of a method 800 of registering a downstream unified-protocol transaction of a user-defined subsystem of a circuit design, according to an embodiment.

FIG. 8 is a flowchart of a method 800 of registering a downstream unified-protocol transaction of a user-defined subsystem of a circuit design, according to an embodiment. Method 800 may represent an example embodiment of registration at 412 of FIG. 4. Method 800 is described below with reference to FIGS. 1-3, and with respect the first user-defined subsystem of circuit design 104, described further above. Method 800 is not, however, limited to the foregoing examples.

At 802, subsystem monitor 312-1 receives a downstream unified-protocol transaction 310 (i.e., corresponding to a transaction 206-1 of node 208-1).

At 804, subsystem monitor 312-1 adds the downstream unified-protocol transaction 310 to a downstream linked list 604, based on an address of the downstream unified-protocol transaction 310.

At 806, subsystem monitor 312-1 determines whether header information of the address is in downstream map 602. If header information of the address is not in downstream map 602, there are no upstream transactions for the address (e.g., normal reads and non-posted writes). In this situation, subsystem monitor 312-1 returns to a prior state at 808. If header information of the address is in downstream map 602, processing proceeds to 810.

At 810, subsystem monitor 312-1 traverses upstream map 502 based on header information.

At 812, subsystem monitor 312-1 attempts to correlate the downstream unified-protocol transaction 310 received at 802 to an upstream unified-protocol transaction 310 (e.g., based on address, data, and/or sideband signals).

At 814, if subsystem monitor 312-1 finds a correlation, subsystem monitor 312-1 may perform an integrity check at 814. Otherwise, processing proceeds to 820.

At 820, subsystem monitor 312-1 reports results of the correlation attempt (i.e., success or failure), and results of any integrity checks, to application manager 306.

Figure 9:
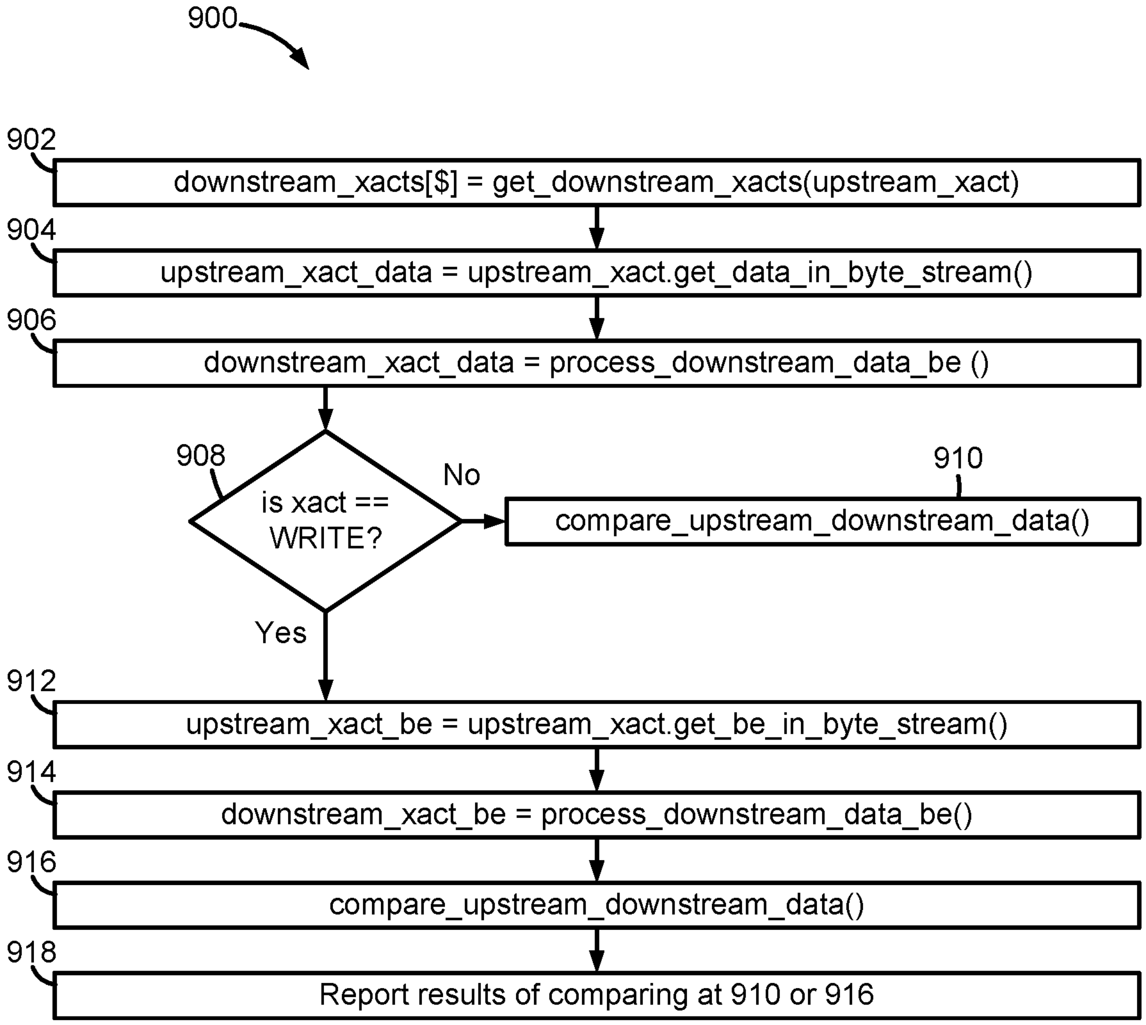
FIG. 9 is a flowchart of a method of performing integrity checks, according to an embodiment.

Example integrity checking techniques are described below with reference to FIG. 9. FIG. 9 is a flowchart of a method 900 of performing integrity checks, according to an embodiment.

At 902, subsystem monitor 312-1 retrieves downstream transactions corresponding to an upstream transaction. There may be multiple downstream transactions for a single upstream transactions, as the transaction may be split to multiple downstream transactions.

At 904, subsystem monitor 312-1 retrieves data of the upstream transaction, in byte stream format.

At 906, subsystem monitor 312-1 processes data in the downstream transaction(s) retrieved at 902 is processed to provide byte stream formatted data for comparison.

At 908, if the transaction is a write transaction, processing proceeds to 910, where subsystem monitor 312-1 compares the byte stream formatted data of the upstream transaction and the downstream transaction(s).

At 912, subsystem monitor 312-1 retrieves a byte enable of the upstream transaction, in the byte stream format.

At 914, subsystem monitor 312-1 retrieves a byte enable of the downstream transaction(s), in the byte stream format.

At 916, subsystem monitor 312-1 compares the byte stream formatted byte enables of upstream and downstream transactions.

At 918, subsystem monitor 312-1 reports results of the comparing 910 or 916 to application manager 306.

Figure 10:
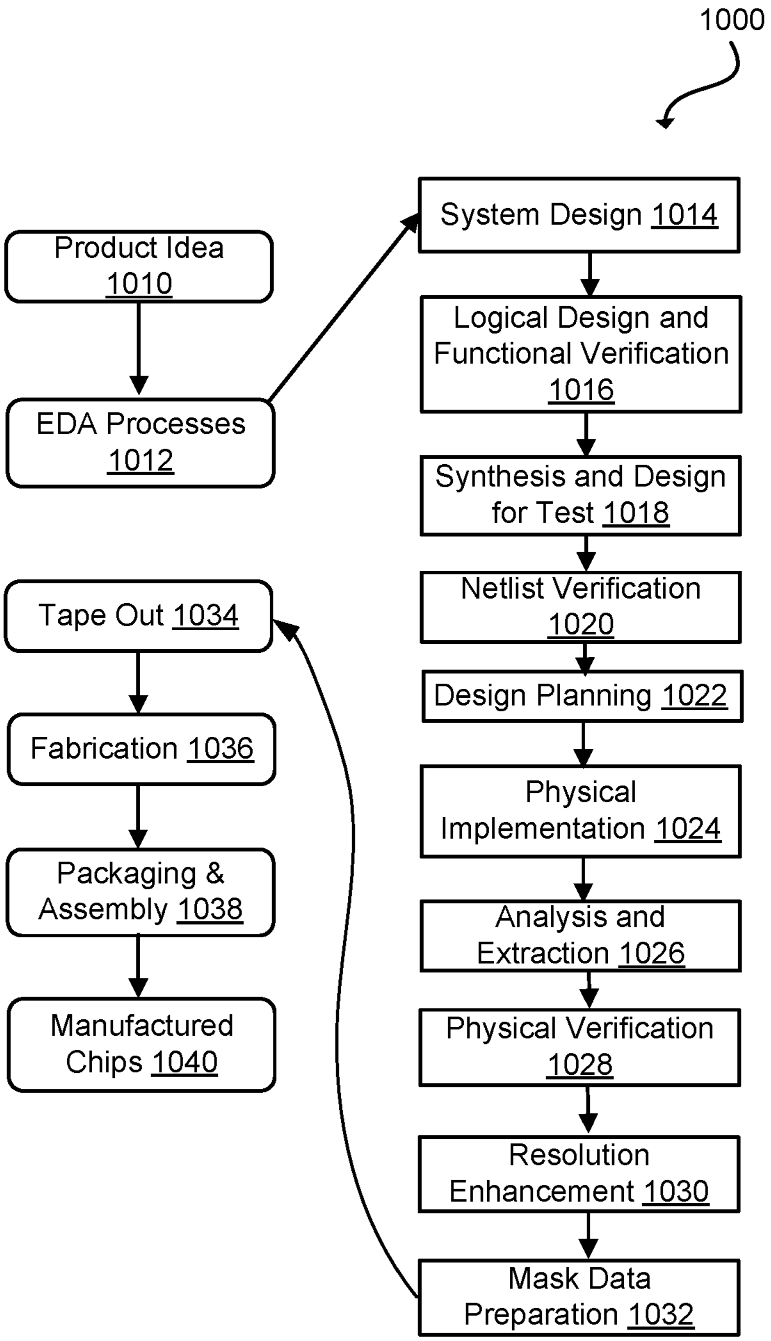
FIG. 10 depicts a flowchart of various processes used during the design and manufacture of an integrated circuit in accordance with some embodiments of the present disclosure.

FIG. 10 illustrates an example set of processes 1000 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1010 with information supplied by a designer, information which is transformed to create an article of manufacture that uses a set of EDA processes 1012. When the design is finalized, the design is taped-out 1034, which is when artwork (e.g., geometric patterns) for the integrated circuit is sent to a fabrication facility to manufacture the mask set, which is then used to manufacture the integrated circuit. After tape-out, a semiconductor die is fabricated 1036 and packaging and assembly processes 1038 are performed to produce the finished integrated circuit 1040.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 10. The processes described by be enabled by EDA products (or EDA systems).

During system design 1014, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1016, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as ‘emulators’ or ‘prototyping systems’ are used to speed up the functional verification.

During synthesis and design for test 1018, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1020, the netlist is checked for compliance with timing constraints and for correspondence with the HDL code. During design planning 1022, an overall floor plan for the integrated circuit is constructed and analyzed for timing and top-level routing.

During layout or physical implementation 1024, physical placement (positioning of circuit components such as transistors or capacitors) and routing (connection of the circuit components by multiple conductors) occurs, and the selection of cells from a library to enable specific logic functions can be performed. As used herein, the term ‘cell’ may specify a set of transistors, other components, and interconnections that provides a Boolean logic function (e.g., AND, OR, NOT, XOR) or a storage function (such as a flipflop or latch). As used herein, a circuit ‘block’ may refer to two or more cells. Both a cell and a circuit block can be referred to as a module or component and are enabled as both physical structures and in simulations. Parameters are specified for selected cells (based on ‘standard cells’) such as size and made accessible in a database for use by EDA products.

During analysis and extraction 1026, the circuit function is verified at the layout level, which permits refinement of the layout design. During physical verification 1028, the layout design is checked to ensure that manufacturing constraints are correct, such as DRC constraints, electrical constraints, lithographic constraints, and that circuitry function matches the HDL design specification. During resolution enhancement 1030, the geometry of the layout is transformed to improve how the circuit design is manufactured.

During tape-out, data is created to be used (after lithographic enhancements are applied if appropriate) for production of lithography masks. During mask data preparation 1032, the ‘tape-out’ data is used to produce lithography masks that are used to produce finished integrated circuits.

A storage subsystem of a computer system (such as computer system 1200 of FIG. 12, or host system 1107 of FIG. 11) may be used to store the programs and data structures that are used by some or all of the EDA products described herein, and products used for development of cells for the library and for physical and logical design that use the library.

Figure 11:
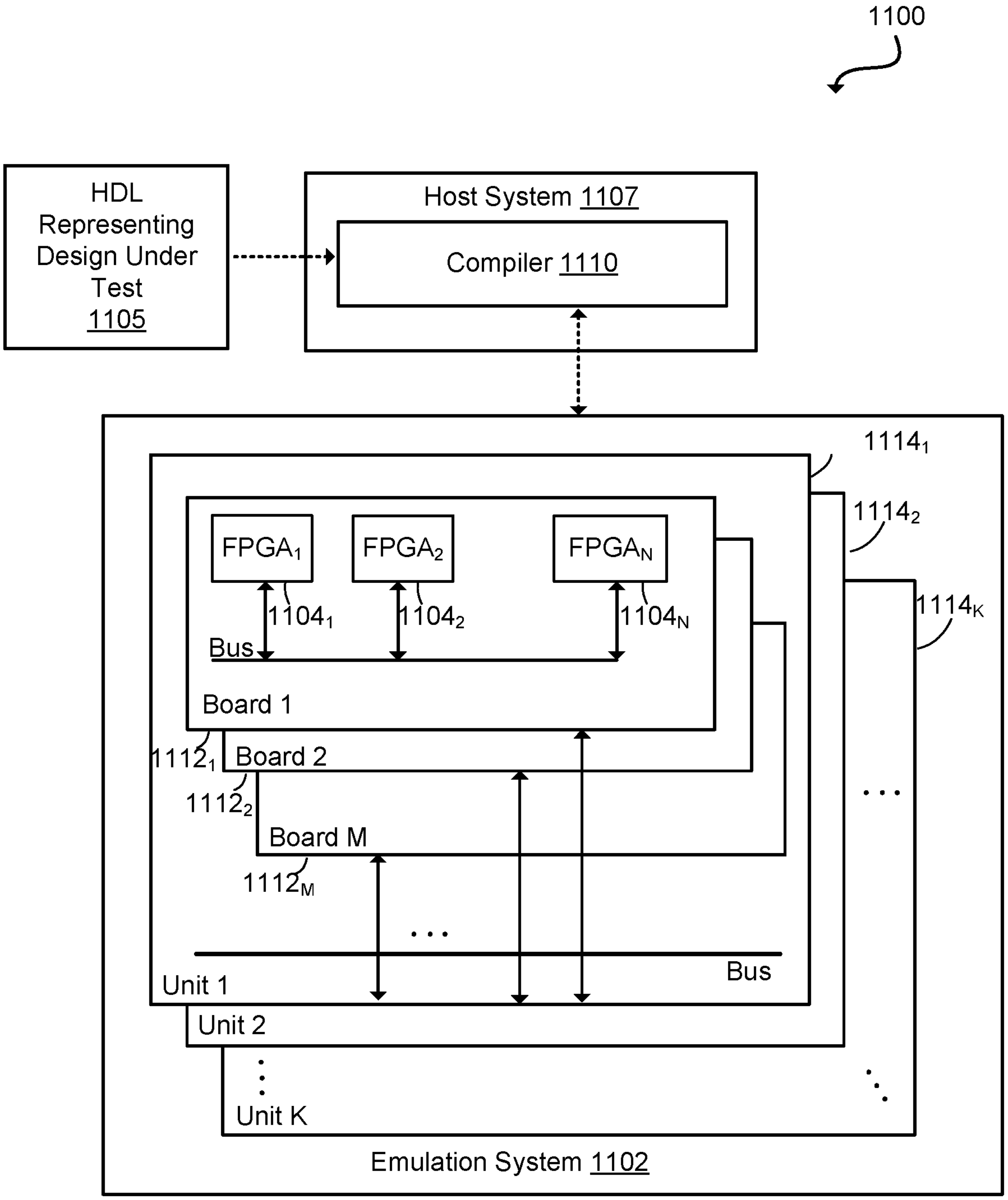
FIG. 11 depicts a diagram of an example emulation system in accordance with some embodiments of the present disclosure.

FIG. 11 depicts a diagram of an example emulation environment 1100. An emulation environment 1100 may be configured to verify the functionality of the circuit design. The emulation environment 1100 may include a host system 1107 (e.g., a computer that is part of an EDA system) and an emulation system 1102 (e.g., a set of programmable devices such as Field Programmable Gate Arrays (FPGAs) or processors). The host system generates data and information by using a compiler 1110 to structure the emulation system to emulate a circuit design. A circuit design to be emulated is also referred to as a Design Under Test (‘DUT’) where data and information from the emulation are used to verify the functionality of the DUT.

The host system 1107 may include one or more processors. In the embodiment where the host system includes multiple processors, the functions described herein as being performed by the host system can be distributed among the multiple processors. The host system 1107 may include a compiler 1110 to transform specifications written in a description language that represents a DUT and to produce data (e.g., binary data) and information that is used to structure the emulation system 1102 to emulate the DUT. The compiler 1110 can transform, change, restructure, add new functions to, and/or control the timing of the DUT.

The host system 1107 and emulation system 1102 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 1102.11. The host system 1107 and emulation system 1102 can exchange data and information through a third device such as a network server.

The emulation system 1102 includes multiple FPGAs (or other modules) such as FPGAs $\mathbf{1104}_1$ and $\mathbf{1104}_2$ as well as additional FPGAs to $\mathbf{1104}_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 1102 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $\mathbf{1104}_1$-$\mathbf{804}_N$ may be placed onto one or more boards $\mathbf{1112}_1$ and $\mathbf{1112}_2$ as well as additional boards through $\mathbf{1112}_M$. Multiple boards can be placed into an emulation unit $\mathbf{1114}_1$. The boards within an emulation unit can be connected using the backplane of the emulation unit or any other types of connections. In addition, multiple emulation units (e.g., 1114$_1$ and 1114$_2$ through 1114$_K$) can be connected to each other by cables or any other means to form a multi-emulation unit system.

For a DUT that is to be emulated, the host system 1107 transmits one or more bit files to the emulation system 1102. The bit files may specify a description of the DUT and may further specify partitions of the DUT created by the host system 1107 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 1107 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAS each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 1107 and/or the compiler 1110 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 1105 into gate level logic. For a DUT that is to be emulated, the design synthesizer sub-system receives a description of the DUT. If the description of the DUT is fully or partially in HDL (e.g., RTL or other level of representation), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 12:
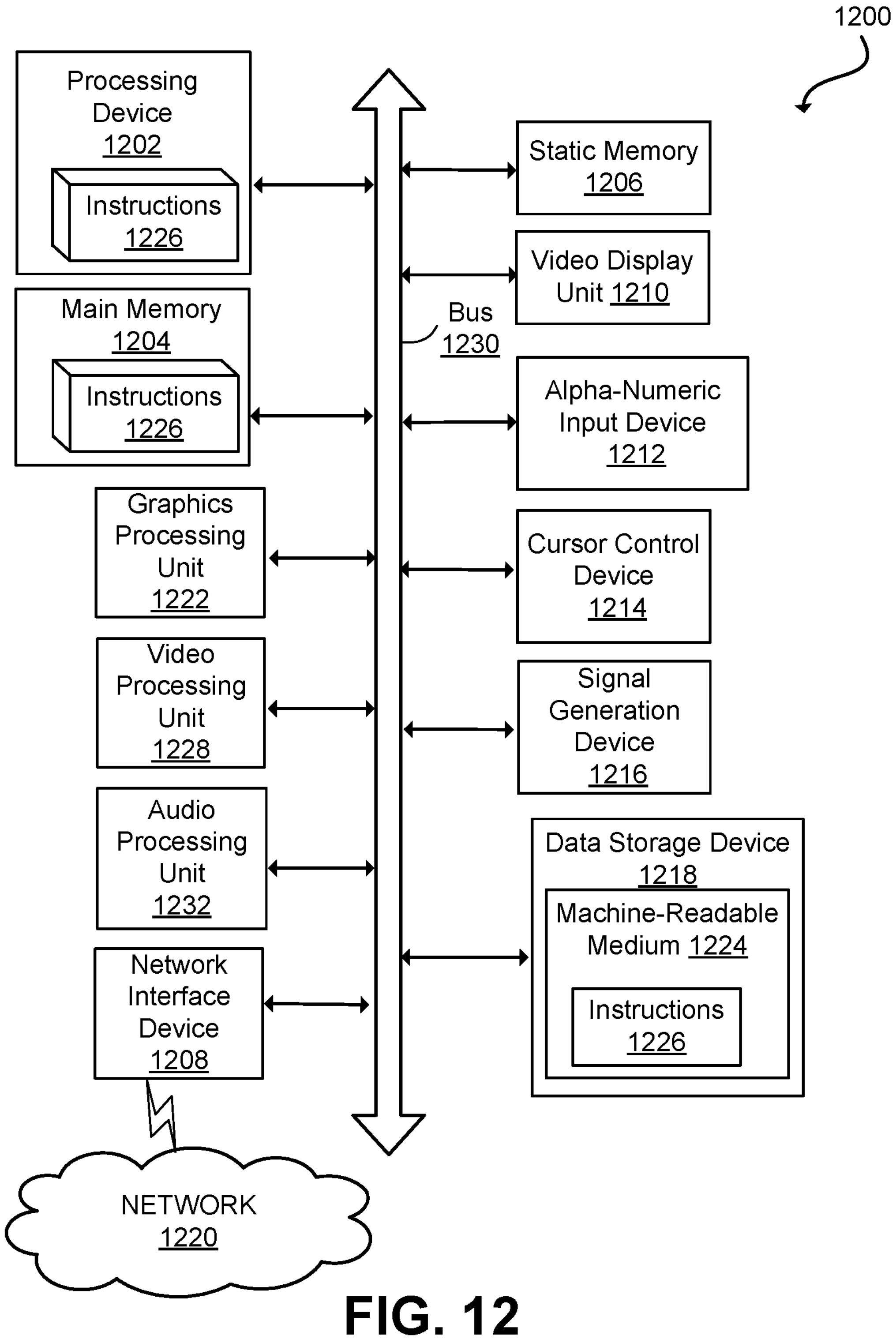
FIG. 12 depicts a diagram of an example computer system in which embodiments of the present disclosure may operate.

FIG. 12 illustrates an example machine of a computer system 1200 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM), a static memory 1206 (e.g., flash memory, static random access memory (SRAM), etc.), and a data storage device 1218, which communicate with each other via a bus 1230.

Processing device 1202 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. The processing device 1202 may be configured to execute instructions 1226 for performing the operations and steps described herein.

The computer system 1200 may further include a network interface device 1208 to communicate over the network 1220. The computer system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a graphics processing unit 1222, a signal generation device 1216 (e.g., a speaker), graphics processing unit 1222, video processing unit 1228, and audio processing unit 1232.

The data storage device 1218 may include a machine-readable storage medium 1224 (also known as a non-transitory computer-readable medium) on which is stored one or more sets of instructions 1226 or software embodying any one or more of the methodologies or functions described herein. The instructions 1226 may also reside, completely or at least partially, within the main memory 1204 and/or within the processing device 1202 during execution thereof by the computer system 1200, the main memory 1204 and the processing device 1202 also constituting machine-readable storage media.

In some implementations, the instructions 1226 include instructions to implement functionality corresponding to the present disclosure. While the machine-readable storage medium 1224 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1202 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A non-transitory computer readable medium comprising stored instructions, which when executed by a processor, cause the processor to:

convert upstream and downstream transactions of a subsystem of a circuit design from protocols of the respective upstream and downstream transactions to a unified protocol to provide respective upstream and downstream unified protocol transactions; and correlate the upstream unified protocol transactions of the subsystem with the downstream unified protocol transactions of the subsystem.

2. The non-transitory computer readable medium of claim 1, wherein the subsystem of the circuit design is user defined.

3. The non-transitory computer readable medium of claim 1, further comprising instructions to cause the processor to:

convert upstream and downstream transactions of multiple user-defined subsystems of the circuit design from protocols of the respective upstream and downstream transactions to the unified protocol; and correlate the upstream unified protocol transactions of the subsystems with the downstream unified protocol transactions of the respective subsystems.

4. The non-transitory computer readable medium of claim 1, further comprising instructions to cause the processor to:

correlate the upstream unified protocol transactions with the downstream unified protocol transactions based on destination addresses of the respective upstream and downstream unified protocol transactions.

5. The non-transitory computer readable medium of claim 4, further comprising instructions to cause the processor to:

correlate the upstream unified protocol transactions with the downstream unified protocol transactions based further on data of the respective upstream and downstream unified protocol transactions.

6. The non-transitory computer readable medium of claim 4, further comprising instructions to cause the processor to:

correlate the upstream unified protocol transactions with the downstream unified protocol transactions based further on start times of the respective upstream and downstream unified protocol transactions.

7. The non-transitory computer readable medium of claim 4, further comprising instructions to cause the processor to:

encode protocol-specific sideband signals of the upstream transactions of the subsystem within the upstream unified protocol transactions; and correlate the upstream and downstream unified protocol transactions based further on the protocol-specific sideband signals encoded within the upstream unified protocol transactions.

8. The non-transitory computer readable medium of claim 4, further comprising instructions to cause the processor to:

correlate the upstream unified protocol transactions with the downstream unified protocol transactions based further on transaction identifiers associated with the respective upstream and downstream unified protocol transactions.

9. The non-transitory computer readable medium of claim 4, further comprising instructions to cause the processor to:

correlate the upstream unified protocol transactions with the downstream unified protocol transactions independent of the protocols of the circuit design.

10. The non-transitory computer readable medium of claim 1, further comprising instructions to cause the processor to:

correlate the upstream unified protocol transactions with the downstream unified protocol transactions based on a configurable correlation policy.

11. The non-transitory computer readable medium of claim 1, further comprising instructions to cause the processor to:

perform an integrity check on the correlated upstream and downstream unified protocol transactions.

12. The non-transitory computer readable medium of claim 1, further comprising instructions to cause the processor to:

record the upstream unified protocol transactions in address-specific upstream linked lists based on destination addresses of the respective upstream unified protocol transactions sorted by start times of the respective upstream unified protocol transactions; and maintain an upstream transactions map, wherein keys of the upstream transactions map are based on the destination addresses of the upstream unified protocol transactions, and wherein values of the upstream transactions map comprise pointers to the respective address-specific upstream linked lists.

13. The non-transitory computer readable medium of claim 12, further comprising instructions to cause the processor to:

record the downstream unified protocol transactions in address-specific downstream linked lists based on destination addresses of the respective downstream unified protocol transactions; and maintain a downstream transaction map, wherein keys of the downstream transaction map are based on the destination addresses of the downstream unified protocol transactions, and wherein values of the downstream transaction map comprise pointers to the respective address-specific downstream linked lists.

14. The non-transitory computer readable medium of claim 13, further comprising instructions to cause the processor to correlate by:

examining the downstream transaction map based on a destination address of an upstream unified protocol transaction to identify a respective one of the downstream linked lists; and traversing the identified downstream linked list for a downstream transaction that correlates to the upstream unified protocol transaction.

15. The non-transitory computer readable medium of claim 13, further comprising instructions to cause the processor to correlate by:

examining the upstream transaction map based on a destination address of a downstream unified protocol transaction to identify a respective one of the upstream linked lists; and traversing the identified upstream linked list for an upstream transaction that correlates to the downstream unified protocol transaction.

16. The non-transitory computer readable medium of claim 1, further comprising application manager instructions to cause the processor to:

permit a user to configure protocol-specific tests on the upstream and downstream unified protocol transactions; and permit a user to configure circuit design-specific tests on the upstream and downstream unified protocol transactions.

17. A machine-implemented method, comprising:

converting transactions of a circuit design from protocols of the respective transaction to a unified protocol to provide respective unified protocol transactions; and monitoring multiple user-defined subsystems of the circuit design, including correlating upstream unified protocol transactions of the subsystems with downstream unified protocol transactions of the respective subsystems.

18. The method of claim 17, wherein the correlating comprises on one or more of:

correlating destination addresses of the upstream unified protocol transactions of the subsystems with destination addresses of the downstream unified protocol transactions of the respective subsystems;

correlating data of the upstream unified protocol transactions of the subsystems with data of the downstream unified protocol transactions of the respective subsystems;

correlating start times of the upstream unified protocol transactions of the subsystems with start times of the downstream unified protocol transactions of the respective subsystems;

correlating the upstream unified protocol transactions of the subsystems with the downstream unified protocol transactions of the respective subsystems based on sideband signal encoded within the respective unified protocol transactions; and correlating transaction identifiers of the upstream unified protocol transactions of the subsystems with transaction identifiers of the downstream unified protocol transactions of the respective subsystems.

19. An apparatus, comprising:

memory circuitry comprising instructions stored therein; and a processor configured to retrieve the instructions from the memory circuitry and to execute the instructions, wherein the instructions, when executed, cause the processor to:

convert upstream and downstream transactions of multiple subsystems of a circuit design from protocols of the respective upstream and downstream transactions to a unified protocol to provide respective upstream and downstream unified protocol transactions;

correlate the upstream unified protocol transactions of the subsystems with the downstream unified protocol transactions of the respective subsystems based at least in part on destination addresses of the respective upstream and downstream unified protocol transactions;

perform an integrity check on the correlated upstream and downstream transactions; and report results of the correlating and results of the integrity checking.

20. The apparatus of claim 19, wherein the instructions, when executed, further cause the processor to:

correlate the upstream unified protocol transactions of the subsystems with the downstream unified protocol transactions of the respective subsystems based further on one or more of, data of the respective unified protocol transactions, start times of the respective unified protocol transactions, sideband signal encoded within the respective unified protocol transactions, and transaction identifiers of the respective unified protocol transactions.

* * * * *